(12) United States Patent  
Yu et al.

(10) Patent No.: US 9,230,853 B2  
(45) Date of Patent: Jan. 5, 2016

(54) SEMICONDUCTOR DEVICES HAVING BIT LINE CONTACT PLUGS AND METHODS OF MANUFACTURING THE SAME

(71) Applicant: SK hynix Inc., Icheon-si Gyeonggi-do (KR)

(72) Inventors: Jae Seon Yu, Icheon-si (KR); Sang Rok Oh, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/685,685

(22) Filed: Apr. 14, 2015

(65) Prior Publication Data

US 2015/0221548 A1 Aug. 6, 2015

Related U.S. Application Data

(62) Division of application No. 13/846,660, filed on Mar. 18, 2013, now Pat. No. 9,082,827.

(30) Foreign Application Priority Data

Aug. 31, 2012 (KR) .......................... 10-2012-0096287

(51) Int. Cl.
*H01L 21/768* (2006.01)  
*H01L 23/498* (2006.01)  
*H01L 27/02* (2006.01)  
*H01L 27/108* (2006.01)

(52) U.S. Cl.
CPC .... *H01L 21/76802* (2013.01); *H01L 21/76816* (2013.01); *H01L 21/76877* (2013.01); *H01L 21/76879* (2013.01); *H01L 23/49827* (2013.01); *H01L 27/108* (2013.01); *H01L 27/10888* (2013.01); *H01L 27/0207* (2013.01); *H01L 27/10876* (2013.01); *H01L 27/10891* (2013.01); *H01L 2924/0002* (2013.01)

(58) Field of Classification Search
CPC .................... H01L 27/10888; H01L 21/76816  
See application file for complete search history.

(56) References Cited

U.S. PATENT DOCUMENTS

2011/0217820 A1* 9/2011 Cho ...................... H01L 21/768  
438/270

* cited by examiner

*Primary Examiner* — Amar Movva  
(74) *Attorney, Agent, or Firm* — William Park & Associates Ltd.

(57) ABSTRACT

A semiconductor device including active regions defined in a semiconductor substrate to be non-parallel with a first direction and a second direction which are perpendicular to each other, word lines intersecting active regions and extending in first directions to be spaced apart from each other in the second direction, bit lines crossing over word lines and extending in second directions to be spaced apart from each other in the first direction, first impurity regions disposed in respective ones of central portions of active regions to non-overlap with the word lines, second impurity regions disposed in both ends of each of the active regions to non-overlap with the word lines, and bit line contact plugs disposed between the first impurity regions and the bit lines. The bit line contact plugs having longish shapes including major axes substantially parallel with the second direction and minor axes substantially parallel with the first direction.

19 Claims, 16 Drawing Sheets

SEMICONDUCTOR DEVICES HAVING BIT LINE CONTACT PLUGS AND METHODS OF MANUFACTURING THE SAME

CROSS-REFERENCE TO RELATED APPLICATION

The present application claims priority under 35 U.S.C 119(a) to Korean Application No. 10-2012-0096287, filed on Aug. 31, 2012, in the Korean Intellectual Property Office, which is incorporated herein by reference in its entirety as set forth in full.

BACKGROUND

Embodiments of the present disclosure generally relate to semiconductor devices and methods of manufacturing the same and, more particularly, to semiconductor devices having bit line contact plugs and methods of manufacturing the same.

In general, a dynamic random access memory (DRAM) device may include a plurality of memory cells, and each of the DRAM cells may include a cell transistor and a cell capacitor electrically connected to the cell transistor to store a data therein. The cell transistors may be formed in and/or on active regions which are defined in a semiconductor substrate, and the cell capacitors may be electrically connected to the cell transistors through contact pads and contact plugs. Recently, as semiconductor devices having unit cells become more highly integrated, areas (planar areas) that the unit cells occupy have been abruptly reduced. Thus, various process technologies for forming fine patterns as well as various cell layouts for obtaining compact cell structures have been proposed to realize highly integrated semiconductor devices. A semiconductor device including active regions, word lines and bit lines extending in different directions form each other is taught in U.S. Pat. No. 6,809,364 B2 to Matsuoka et al., entitled "Semiconductor Integrated Circuit Device and A Method of Manufacture Thereof".

According to the U.S. Pat. No. 6,809,364 B2, the semiconductor device includes word lines extending in a first direction, bit lines extending in a second direction perpendicular to the first direction, and active region disposed to extend in a diagonal direction that is non-parallel with both the word lines and the bit lines. In such a case, bit line contact plugs may be disposed to be adjacent to storage node contact plugs. Thus, there may be every probability of electrical shortage between the bit line contact plugs and the storage node contact plugs. This electrical shortage phenomenon may occur due to a short distance between the bit line contact plugs and the storage node contact plugs. Accordingly, various cell structures and/or various process techniques are still required to realize highly integrated semiconductor devices.

SUMMARY

Various embodiments are directed to semiconductor devices having bit line contact plugs and methods of manufacturing the same.

According to various embodiments, a semiconductor device includes active regions defined in a semiconductor substrate to be non-parallel with a first direction and a second direction which are perpendicular to each other, word lines intersecting the active regions and extending in the first direction to be spaced apart from each other in the second direction, bit lines crossing over the word lines and extending in the second direction to be spaced apart from each other in the first direction, first impurity regions disposed in respective ones of central portions of the active regions to non-overlap with the word lines, second impurity regions disposed in both ends of each of the active regions to non-overlap with the word lines, and bit line contact plugs disposed between the first impurity regions and the bit lines. Each of the bit line contact plugs has a longish shape including a major axis substantially parallel with the second direction and a minor axis substantially parallel with the first direction.

In various embodiments, each of the bit line contact plugs may include a pair of first sidewalls opposite to each other and a pair of second sidewalls opposite to each other. Further, the first sidewalls of the bit line contact plugs may be in contact with a first insulation layer and a second insulation layer which are stacked, and the second sidewalls of the bit line contact plugs may be in contact with only the second insulation layer. In addition, the first insulation layer may be an oxide layer when the second insulation layer is a nitride layer, or the first insulation layer may be a nitride layer when the second insulation layer is an oxide layer.

In various embodiments, the semiconductor device may further include bit line spacers between the first sidewalls of the bit line contact plugs and the first and second insulation layers.

In some embodiments, each of the bit line contact plugs may have an oval shape which is parallel with the second direction when viewed from a plan view.

In various embodiments, the semiconductor device may further include storage node contact plugs which are disposed between the bit lines and which are electrically connected to respective ones of the second impurity regions.

According to various embodiments, a method of manufacturing a semiconductor device includes defining an active region in a semiconductor substrate, forming line-shaped first insulation patterns on the semiconductor substrate to intersect the active region and to extend in a first direction, forming a second insulation layer on the first insulation patterns to fill spaces between the first insulation patterns, and patterning the second insulation layer and the first insulation patterns to form a contact hole exposing a portion of the active region. The contact hole is formed to include a pair of first opposite sidewalls exposing the first insulation patterns and the second insulation layer and a pair of second opposite sidewalls exposing only the second insulation layer. The second insulation layer is isotropically etched to enlarge the contact hole in a second direction substantially perpendicular to the first direction, and a conductive contact plug is formed to fill the enlarged contact hole. The first opposite sidewalls of the contact hole are substantially parallel with the second direction and the second opposite sidewalls of the contact hole are substantially parallel with the first direction.

In various embodiments, the first insulation patterns may have a different etch rate from the second insulation layer while the second insulation layer is isotropically etched to enlarge the contact hole in substantially the second direction.

In various embodiments, the contact hole may be formed by etching the second insulation layer and the first insulation patterns using an anisotropic etch process that exhibits substantially the same etch rate with respect to the second insulation layer and the first insulation patterns.

In various embodiments, isotropically etching the second insulation layer to enlarge the contact hole in the second direction may be performed by an isotropic etch process exhibiting an etch condition that an etch rate of the second insulation layer is faster than that of the first insulation patterns.

In various embodiments, the isotropic etch process may be a dry etch process performed using plasma or a wet etch process performed using an etchant.

According to various embodiments, a method of manufacturing a semiconductor device includes defining active regions in a semiconductor substrate, forming line-shaped first insulation patterns on the semiconductor substrate to intersect the active regions and to extend in a first direction, forming a second insulation layer on the first insulation patterns to fill spaces between the first insulation patterns, and patterning the second insulation layer and the first insulation patterns to form contact holes exposing respective ones of central portions of the active regions. Each of the contact holes is formed to include a pair of first opposite sidewalls exposing two adjacent ones of the first insulation patterns and the second insulation layer and a pair of second opposite sidewalls exposing only the second insulation layer. The second insulation layer is isotropically etched to enlarge the contact holes in a second direction perpendicular to the first direction. Contact patterns are formed to fill respective ones of the enlarged contact holes. A conductive layer is formed on the second insulation layer and the contact patterns. The conductive layer is patterned to form bit lines that extend in the second direction and contact the contact patterns. The contact patterns are etched using the bit lines as etch masks to form bit line contact plugs vertically aligned with the bit lines. Insulation spacers are formed on sidewalls of the bit lines and sidewalls of the bit line contact plugs. Storage node contact plugs, which are separated from the bit lines and the bit line contact plugs by the insulation spacers, are formed. The storage node contact plugs are formed to be connected to both ends of the active regions. The first opposite sidewalls of the contact holes are substantially parallel with the second direction and the second opposite sidewalls of the contact holes are substantially parallel with the first direction.

In various embodiments, the first insulation patterns may be mask patterns for defining regions where word lines are formed.

In various embodiments, the first insulation patterns may have a different etch rate from the second insulation layer while the second insulation layer is isotropically etched to enlarge the contact holes in the second direction.

In various embodiments, the contact holes may be formed by etching the second insulation layer and the first insulation patterns using an anisotropic etch process that exhibits substantially the same etch rate with respect to the second insulation layer and the first insulation patterns.

In various embodiments, isotropically etching the second insulation layer to enlarge the contact hole in the second direction may be performed by an isotropic etch process exhibiting an etch condition that an etch rate of the second insulation layer is faster than that of the first insulation patterns.

In various embodiments, the isotropic etch process may be a dry etch process performed using plasma or a wet etch process performed using an etchant.

In various embodiments, the first insulation patterns may be formed of an oxide layer and the second insulation layer may be formed of a nitride layer.

In various embodiments, isotropically etching the second insulation layer to enlarge the contact holes in the second direction may be performed under a pressure of about 5 mTorr to about 100 mTorr and a bias power of about 0 watt to about 150 watts using an inductively coupled plasma (ICP) apparatus or an electron cyclotron resonance (ECR) apparatus.

In various embodiments, isotropically etching the second insulation layer to enlarge the contact holes in the second direction may be performed under a pressure of about 15 mTorr to about 100 mTorr and a bias power of about 0 watt to about 500 watts using a capacitively coupled plasma (CCP) apparatus.

In various embodiments, isotropically etching the second insulation layer to enlarge the contact holes in the second direction may be performed using a main etch gas and a subsidiary gas, the main etch gas may include at least one of a $C_xF_y$ gas where x is a whole number greater than or equal to one and less than or equal to five and y is a whole number greater than or equal to two and less than or equal to eight, a $C_kHF_s$ gas where k and s are whole numbers greater than or equal to one and less than or equal to three, a $NF_3$ gas and a $SF_6$ gas, and the subsidiary gas may include at least one of an oxygen ($O_2$) gas, a CO gas, a COS gas, a nitrogen ($N_2$) gas, a $CH_4$ gas, an argon (Ar) gas and a helium (He) gas.

In various embodiments, isotropically etching the second insulation layer to enlarge the contact holes in the second direction may be performed using a wet etch process that employs a phosphoric acid solution as an etchant.

In various embodiments, the method may further include applying an additional etch process to the substrate including the enlarged contact holes to control sizes and sidewall profiles of the enlarged contact holes before the contact patterns are formed. The additional etch process may be a wet etch process.

In various embodiments, forming the insulation spacers may include depositing a nitride layer on the substrate having the bit lines contact plugs to a thickness of about 20 angstroms to about 400 angstroms and anisotropically etching or etching back the nitride layer.

In various embodiments, the conductive layer may be formed of a polysilicon layer. Patterning the conductive layer to form the bit lines may be performed using an etch process that utilizes a main etch gas and a subsidiary gas. The main etch gas may include at least one of a chlorine (Cl2) gas and a hydrogen bromide (HBr) gas, and the subsidiary gas may include at least one of an oxygen ($O_2$) gas, a nitrogen ($N_2$) gas, an argon (Ar) gas, a helium (He) gas, a methane ($CH_4$) gas and a silicon tetrachloride ($SiCl_4$) gas.

BRIEF DESCRIPTION OF THE DRAWINGS

Embodiments and their concepts will become more apparent in view of the attached drawings and accompanying detailed description, in which:

FIGS. 4C to 10C are plan views illustrating a method of manufacturing a semiconductor device according to various embodiments;

FIGS. 4A to 10A are cross sectional views taken along lines A-A' of FIGS. 4C to 10C; and FIGS. 4B to 10B are cross sectional views taken along lines B-B' of FIGS. 4C to 10C.

DETAILED DESCRIPTION OF THE EMBODIMENTS

Figure 1:
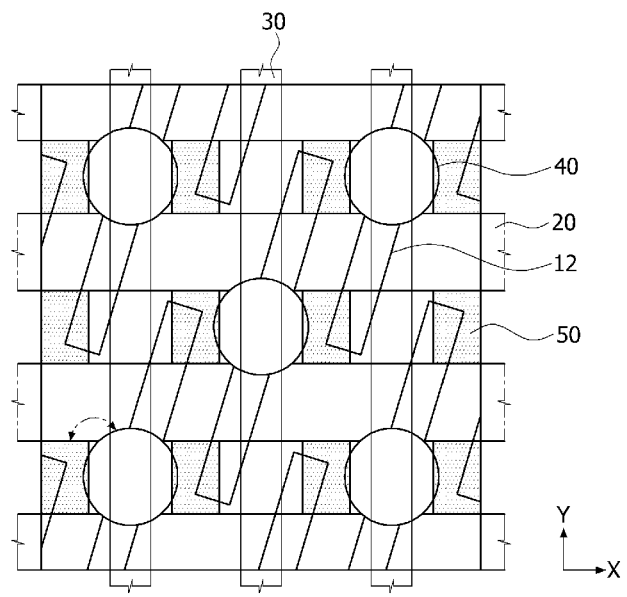
FIG. 1 is a plan view illustrating a layout of a semiconductor device.

FIG. 1 is a plan view illustrating an example of layouts of various semiconductor devices.

Referring to FIG. 1, a plurality of active regions 12 may be disposed in a semiconductor substrate to extend in a first direction which is substantially parallel with a surface of the semiconductor substrate. Word lines 20 may be disposed to intersect the active regions 12. The word lines 20 may extend in a second direction different from the first direction. Impurity regions acting as source/drain regions of cell transistors may be disposed in portions of the active regions, which are non-overlapping with the word lines 20. Bit lines 30 may be disposed to cross over the word lines 20 and may be electrically connected to the impurity regions acting as the drain regions (e.g., common drain regions) of the cell transistors. The bit lines 30 may extend in a third direction which is substantially perpendicular to the word lines 20 and may intersect central regions (e.g., the common drain regions of the cell transistors) of the active regions 12. Cell capacitors (not shown) for storing data may be disposed over the bit lines 30, and storage nodes (e.g., storage electrodes) of the cell capacitors may be electrically connected to respective ones of the impurity regions (e.g., the source regions of the cell transistors) of the active regions 12 through storage node contact plugs 50. The bit lines 30 may be electrically connected to the common drain regions of the active regions 12 through bit line contact plugs 40.

In FIG. 1, the storage node contact plugs 50 may be self-aligned with the bit lines 30 and may be disposed between the bit lines 30. Thus, the storage node contact plugs 50 and the bit line contact plugs 40 may be disposed to be very close to each other in a plan view. As a result, the probability of electrical shortage between the storage node contact plugs 50 and the bit line contact plugs 40 may increase.

To reduce the probability of the electrical shortage between the storage node contact plugs 50 and the bit line contact plugs 40, the bit line contact plugs 40 may be designed to have longish shapes, for example, oval shapes which are substantially parallel with the third direction (e.g., the bit lines 30). However, as a minimum size of the bit line contact plugs 40 is reduced to several tens of nanometers, it may be difficult to form the bit line contact plugs 40 having oval shapes using only a photolithography process. This may be due to a resolution limit of an exposure step of a photolithography process. According to the following embodiments, longish bit line contact plugs may be fabricated by forming circle-shaped bit line contact holes using a photo mask and by enlarging the circle-shaped bit line contact holes in a specific direction using a selective etch process. For example, each of the circle-shaped bit line contact holes may be formed to have a pair of first sidewalls opposite to each other and a pair of second sidewalls opposite to each other. The first sidewalls may correspond to surfaces of a nitride layer, and the second sidewalls may correspond to surfaces of an oxide layer having an etch selectivity with respect to the nitride layer. Thus, if the nitride layer (or the oxide layer) is isotropically etched after formation of the circle-shaped bit line contact holes, the circle-shaped bit line contact holes may be enlarged in one direction (including a positive direction and a negative direction opposite to the positive direction). As a result, the circle-shaped bit line contact holes may be deformed to have oval shapes when viewed from a plan view.

Various embodiments will be described more fully hereinafter with reference to the accompanying drawings, in which various embodiments are shown. In the drawings, like reference designators denote like or corresponding elements.

Figure 2:
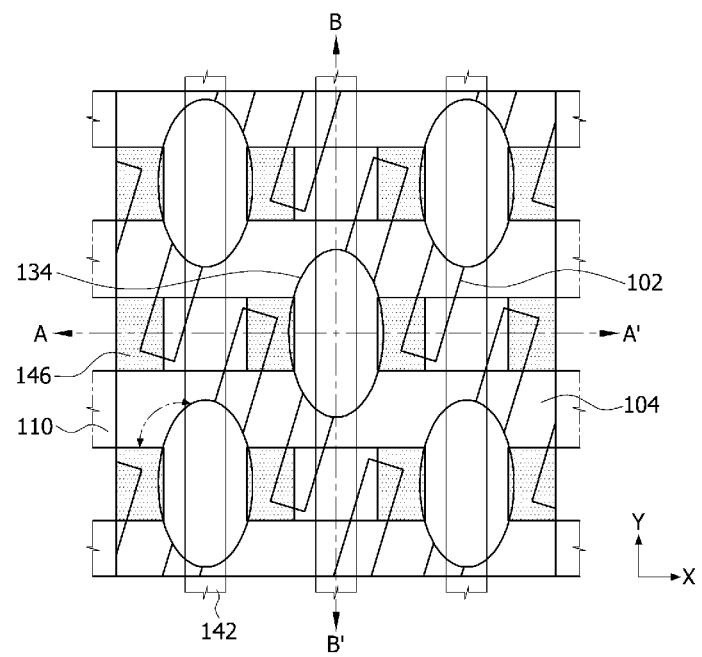
FIG. 2 is a plan view illustrating a layout of a semiconductor device according to various embodiments.
Figure 3A:
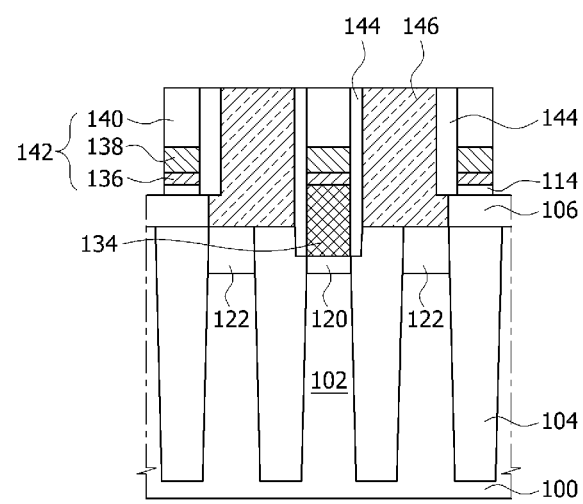
FIG. 3A is a cross sectional view taken along a line A-A' of FIG. 2.
Figure 3B:
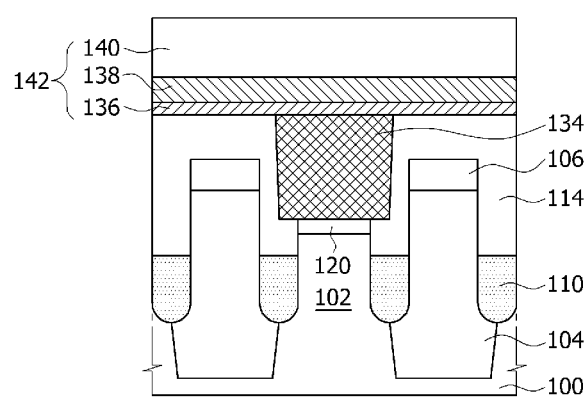
FIG. 3B is a cross sectional view taken along a line B-B' of FIG. 2.

FIG. 2 is a plan view illustrating a layout of a semiconductor device according to various embodiments. Further, FIG. 3A is a cross sectional view taken along a line A-A' of FIG. 2, and FIG. 3B is a cross sectional view taken along a line B-B' of FIG. 2. In FIG. 2, the line A-A' may correspond to a substantially straight line which is substantially parallel with an X-axis and the line B-B' may correspond to a substantially straight line which is substantially parallel with a Y-axis.

Referring to FIGS. 2, 3A and 3B, a semiconductor device according to the embodiment may include word lines 110 disposed to extend in a first direction and arrayed to be spaced apart from each other in a second direction which is substantially perpendicular to the first direction, bit lines 142 disposed to extend in the second direction and arrayed to be spaced apart from each other in the first direction, active regions 102 disposed to be substantially parallel with a third direction which is non-parallel with both the first and second directions, and bit line contact plugs 134 disposed between the bit lines 142 and the active region 102. Each of the active regions 102 may intersect two of the word lines 110. Further, a first impurity region 120 may be disposed in a central portion of each active region 102, and a pair of second impurity regions 122 may be disposed in both edges of each active region 102, respectively. That is, the word lines 110 may overlap with the active regions 102 between the first and second impurity regions 120 and 122 when viewed from a plan view. Moreover, the bit line contact plugs 134 may be disposed between the bit lines 142 and the first impurity regions 120 to electrically connect the bit lines 142 to the first impurity regions 120. Each of the bit line contact plugs 134 may have a longish shape which is substantially parallel with the bit lines 142 in a plan view. For example, each of the bit line contact plugs 134 may substantially have an oval shape that includes a major axis substantially parallel with the second direction and a minor axis substantially parallel with the first direction.

The active regions 102 may be defined by an isolation layer 104 formed in a semiconductor substrate 100 and may be arrayed to be substantially parallel with a diagonal direction in an X-Y plane. The first impurity region 120 (e.g., a central portion) of one of the active regions 102 may be disposed between the second impurity regions 122 of two other active regions 102. The word lines 110 may cross over the active regions 102 and may extend in the first direction. The first impurity regions 120 may act as common drain regions of cell transistors and the second impurity regions 122 may act as source regions of the cell transistors. Thus, a pair of cell transistors may be formed in each of the active regions 102.

The bit lines 142 may cross over the word lines 110, and the first impurity regions 120 of the active regions 102 may be electrically connected to the bit lines 142. The bit lines 142 may intersect the word lines 110 at substantially a right angle in a plan view, as illustrated in FIG. 2. In addition, the bit lines 142 may be disposed to overlap with the first impurity regions 120 of the active regions 102 in a plan view. Call capacitors (not shown) for storing data may be disposed over the bit lines 142, and storage nodes (or storage electrodes) of the call capacitors may be electrically connected to respective ones of the second impurity regions 122 of the active regions 102. Specifically, the storage electrodes of the call capacitors may be electrically connected to respective ones of the second impurity regions 122 of the active regions 102 through storage node contact plugs 146 formed on the second impurity regions 122. The storage node contact plugs 146 may extend into spaces between the bit lines 142, and the storage electrodes may be formed on top surfaces of the storage node contact plugs 146 opposite to the semiconductor substrate 100.

The bit line contact plugs 134 may be disposed between the first impurity regions 120 (formed in the central portions of the active regions 102) and the bit lines 142 to electrically connect the first impurity regions 120 to the bit lines 142. Each of the bit line contact plugs 134 may have a longish shape extending in the second direction which is substantially parallel with the Y-axis. For example, each of the bit line contact plugs 134 may have a major axis substantially parallel with the second direction and a minor axis substantially parallel with the first direction when viewed from a plan view. Thus, a distance between the bit line contact plugs 134 and the storage node contact plugs 146 adjacent thereto may increase as compared with the general semiconductor device illustrated in FIG. 1. As a result, the probability of electrical shortage between the storage node contact plugs 146 and the bit line contact plugs 134 may be reduced. Further, since the bit line contact plugs 134 extend in the second direction, contact areas between the bit line contact plugs 134 and the bit lines 142 may increase. Hence, the contact resistance of the bit lines 142 may be reduced.

FIGS. 4C to 10C are plan views illustrating a method of manufacturing a semiconductor device according to various embodiments. FIGS. 4A to 10A are cross sectional views taken along lines A-A' of FIGS. 4C to 10C, respectively. In addition, FIGS. 4B to 10B are cross sectional views taken along lines B-B' of FIGS. 4C to 10C, respectively. The term "first direction" used herein denotes a direction which is substantially parallel with the line A-A' of FIG. 4C, and the term "second direction" used herein denotes a direction which is substantially parallel with the line B-B' of FIG. 4C.

Figure 4A:
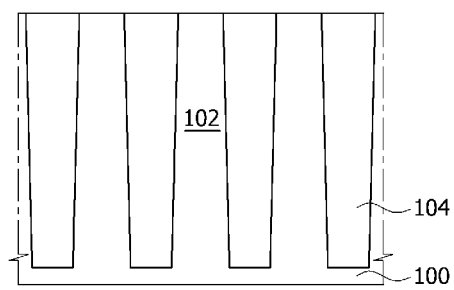
Figure 4B:
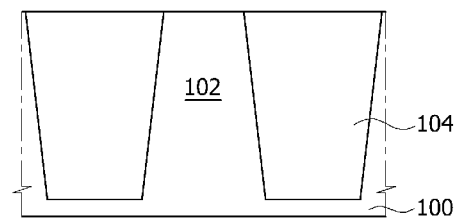
Figure 4C:
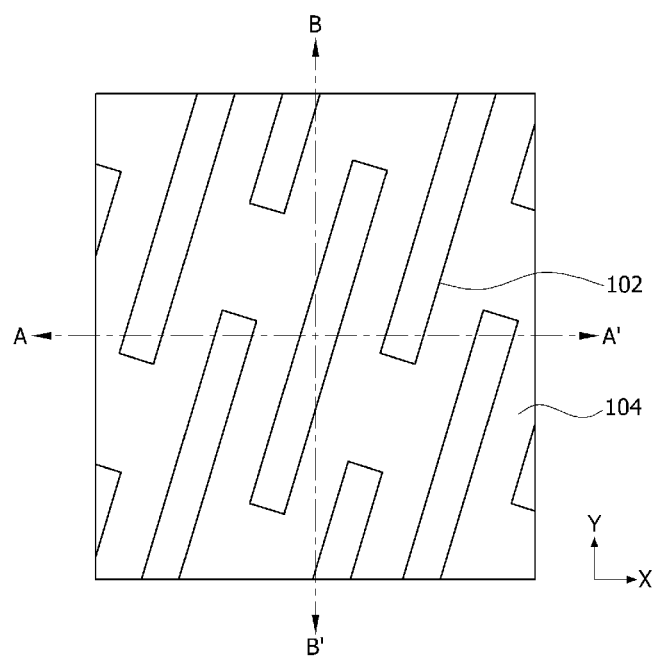

Referring to FIGS. 4A, 4B and 4C, an isolation layer 104 may be formed in a semiconductor substrate 100 such as a silicon wafer, thereby defining active regions 102. The isolation layer 104 may be formed using, for example, a shallow trench isolation process. The isolation layer 104 may be formed to include an oxide layer such as a silicon oxide layer or a nitride layer such as a silicon nitride layer. The active regions 102 may be defined to extend in a diagonal direction which is non-parallel with both the lines A-A' and B-B' in a plan view, as illustrated in FIG. 4C. Each of the active regions 102 may include a central portion and both end portions. That is, each of the active regions 102 may be defined such that both end portions are substantially point symmetric with respect to the central portion.

Figure 5A:
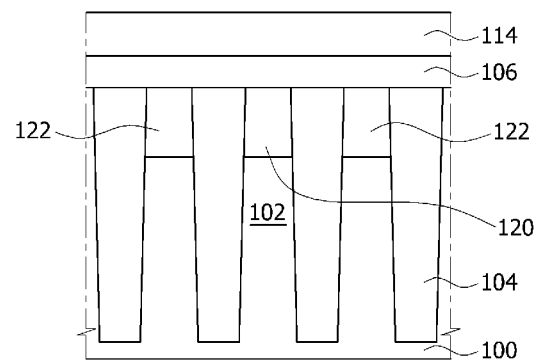
Figure 5B:
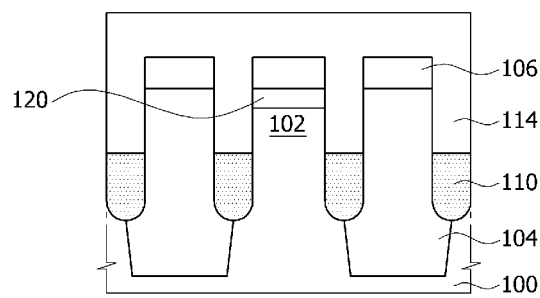
Figure 5C:
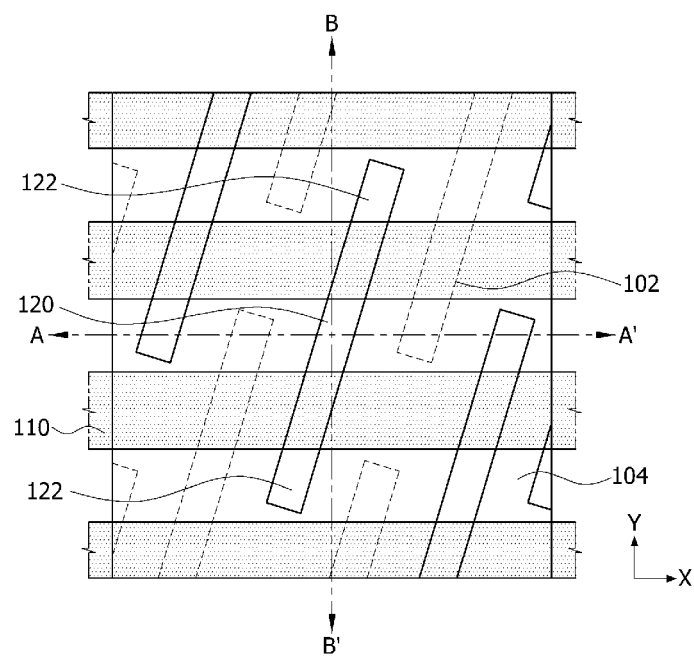

Referring to FIGS. 5A, 5B and 5C, a hard mask pattern 106 for forming buried gates may be formed on the substrate including the isolation layer 104. The hard mask pattern 106 may be formed by depositing an oxide layer on the substrate using a low pressure chemical vapor deposition (LPCVD) process and by patterning the oxide layer. The hard mask pattern 106 may be formed to have line-shaped openings that intersect the active regions 102 to be substantially parallel with the line A-A' of FIG. 4C. Subsequently, portions of the active regions 102 and the isolation layer 104 exposed by the hard mask pattern 106 may be etched to form trenches having a predetermined depth, and a gate oxide layer (not shown) may be formed on inner surfaces of the trenches. A gate conductive layer may be formed on the substrate including the gate oxide layer to fill the trenches. The gate conductive layer may be formed to include a single layer of a titanium nitride (TiN) material or a double layered structure having a titanium nitride (TiN) material and a tungsten (W) material. The gate conductive layer may be planarized to expose the hard mask pattern 106, and the planarized gate conductive layer may be recessed to form buried gates 110 (e.g., word lines) remaining in lower portions of the trenches. Subsequently, a capping layer 114 may be formed to fill the trenches on the buried gates 110 and to cover the hard mask pattern 106. The capping layer 114 may be formed of a nitride layer.

As described above, the buried gates 110 may act as word lines. The word lines may be formed to extend in the first direction which is non-parallel with the active regions 102 and may be formed to intersect the active regions 102. Each of the active regions 102 may intersect two of the word lines. That is, one of the pair of adjacent word lines may cross a region between a central portion and one end portion of the active region 102, and the other of the pair of adjacent word lines may cross a region between the central portion and the other end portion of the active region 102. Subsequently, first impurity regions 120 and second impurity regions 122 may be formed in the central portions of the active regions 102 and the edge portions of the active regions 102, respectively. The word lines 110, the first impurity regions 120 and the second impurity regions 122 may constitute a plurality of cell transistors. In various embodiments, the first and second impurity regions 120 and 122 may be formed by implanting impurity ions into the active regions 102 using the word lines 110 as implantation masks prior to formation of the capping layer 114. The first and second impurity regions 120 and 122 may function as source/drain regions of the cell transistors. Accordingly, a pair of cell transistors may be formed in each active region 102, and one of the pair of cell transistors may share the first impurity region 120 with the other of the pair of cell transistors.

As described later, bit line contact plugs may be formed on respective ones of the first impurity regions 120 to electrically connect the first impurity region 120 to bit lines formed in a subsequent process. Accordingly, each of the bit line contact plugs may be formed to have a longish shape in a plan view. In more detail, the longish bit line contact plugs may be formed by patterning a plurality of stacked material layers having different etch rates to form substantially circle-shaped bit line contact holes, isotropically etching one or more of the stacked material layers to enlarge the substantially circle-shaped bit line contact holes in one direction, and filling the enlarged bit line contact holes with a conductive layer. For example, the bit line contact plugs may be formed in respective ones of bit line contact holes penetrating the capping layer 114, the hard mask pattern 106 and the isolation layer 104. Thus, the capping layer 114 may be formed of a material having an etch selectivity with respect to the hard mask pattern 106 and the isolation layer 104. In various embodiments, the capping layer 114 may be formed of a nitride layer such as a silicon nitride layer, and the hard mask pattern 106 and the isolation layer 104 may be formed of an oxide layer such as a silicon oxide layer.

Figure 6A:
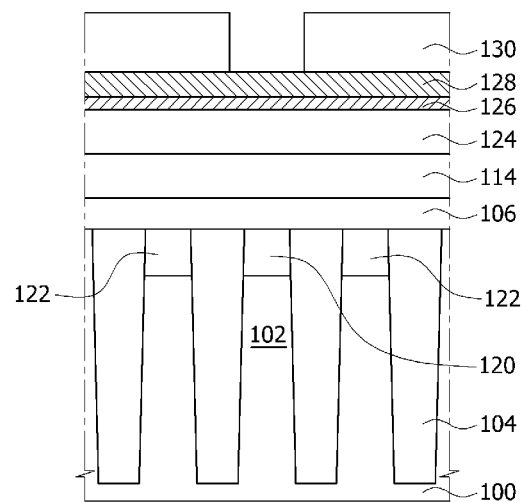
Figure 6B:
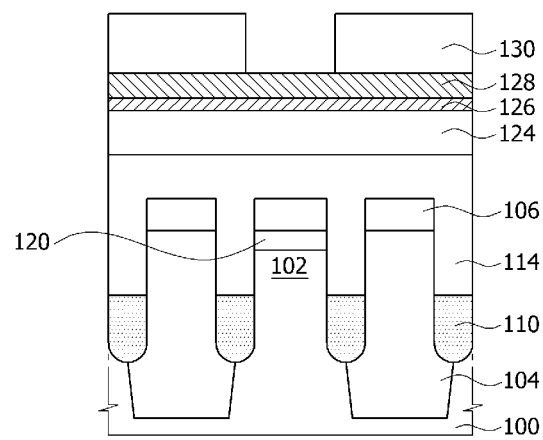
Figure 6C:
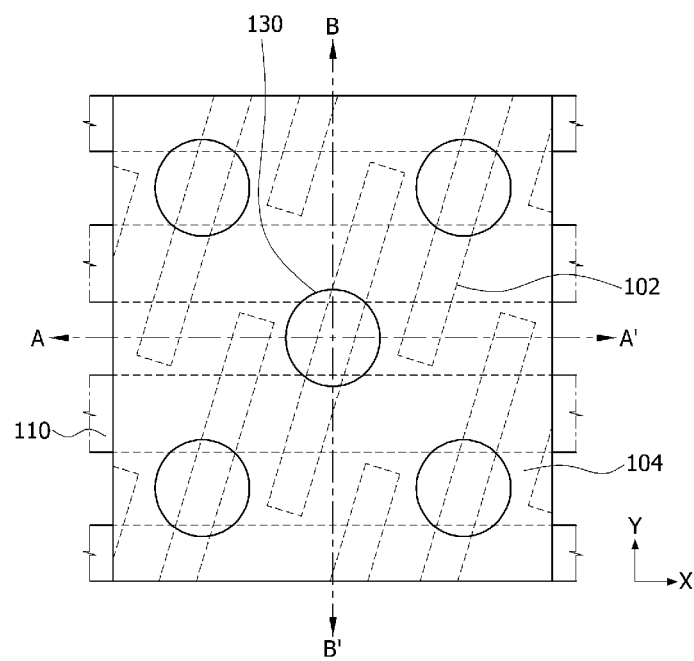

Referring to FIGS. 6A, 6B and 6C, a hard mask layer and an anti-reflection layer 128 may be sequentially formed on the capping layer 114. The hard mask layer may be formed by sequentially stacking a first hard mask layer 124 and a second hard mask layer 126. The first hard mask layer 124 may be formed of an amorphous carbon layer, and the second hard mask layer 126 may be formed of a silicon oxynitride (SiON) layer.

A photoresist pattern 130 may be formed on the anti-reflection layer 128. The photoresist pattern 130 may be formed to include circle-shaped openings for defining regions where bit line contact holes are formed. The circle-shaped openings of the photoresist pattern 130 may be located on respective ones of the first impurity regions 120, as illustrated in FIGS. 6A, 6B and 6C.

Figure 7A:
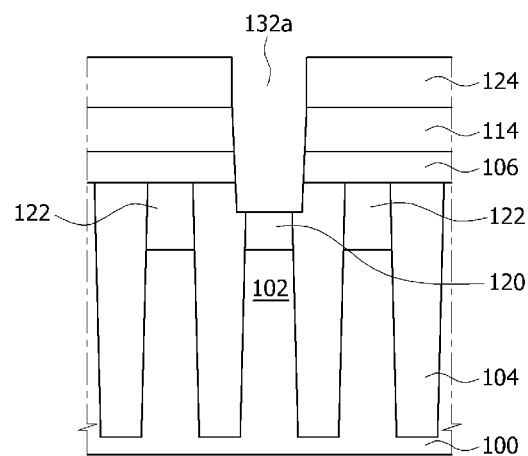
Figure 7B:
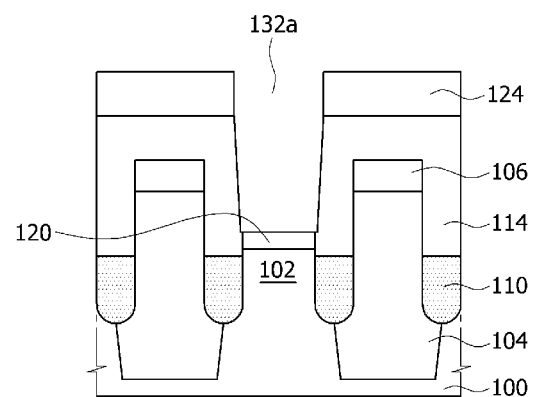
Figure 7C:
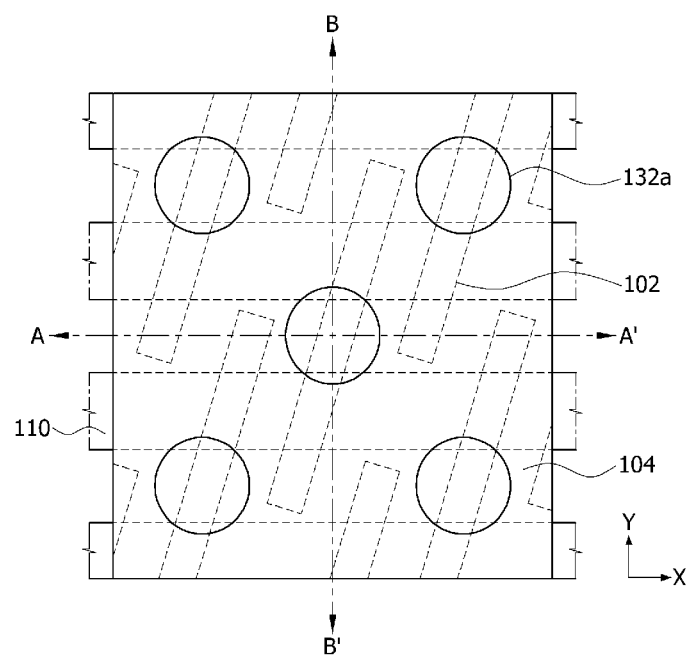

Referring to FIGS. 7A, 7B and 7C, the hard mask layers 124 and 126 and the anti-reflection layer 128 may be etched using the photoresist pattern 130 as an etch mask. Subsequently, the photoresist pattern 130, the etched anti-reflection layer 128 and the etched second hard mask layer 126 may be removed to expose the etched first hard mask layer 124. The capping layer 114 and the hard mask pattern 106 may then be etched using the exposed first hard mask layer 124 as an etch mask, thereby forming first bit line contact holes 132a. The first bit line contact holes 132a may be formed by etching the capping layer 114 and the hard mask pattern 106 without removal of the photoresist pattern 130, the etched anti-reflection layer 128 and the etched second hard mask layer 126.

The first bit line contact holes 132a may be formed to have circular shapes in a plan view as illustrated in FIG. 7C and to expose respective ones of the first impurity regions 120 as illustrated in FIGS. 7A and 7B. In such a case, each of the first bit line contact holes 132a may be formed to include a pair of first sidewalls exposing the isolation layer 104, the hard mask pattern 106 and the capping layer 114, and a pair of second sidewalls exposing only the capping layer 114 (see FIGS. 7A and 7B).

The first bit line contact holes 132a may be formed using an anisotropic etch process. The anisotropic etch process for forming the first bit line contact holes 132a may be performed using at least one of a $C_xF_y$ gas (where, $1 \le x \le 5$ and $2 \le y \le 8$), a $C_xHF_y$ gas (where, $1 \le x \le 3$ and $1 \le y \le 3$), a $NF_3$ gas and a $SF_6$ gas as a main etch gas in order to etch the isolation layer 104 (e.g., a nitride layer), the hard mask pattern 106 (e.g., an oxide layer) and the capping layer 114 (e.g., a nitride layer) at substantially the same etch rate. Further, the anisotropic etch process for forming the first bit line contact holes 132a may be performed with a subsidiary gas in addition to the main etch gas. The subsidiary gas may include at least one of an oxygen ($O_2$) gas, a CO gas, a COS gas, a nitrogen ($N_2$) gas, a $CH_4$ gas, an argon (Ar) gas and a helium (He) gas. Moreover, the anisotropic etch process for forming the first bit line contact holes 132a may be performed with a chlorine ($Cl_2$) gas or a hydrogen bromide (HBr) gas in addition to the main etch gas and the subsidiary gas. In such a case, the semiconductor substrate 100 (e.g., the first impurity regions 120) may be over-etched during the anisotropic etch process for forming the first bit line contact holes 132a.

Figure 8A:
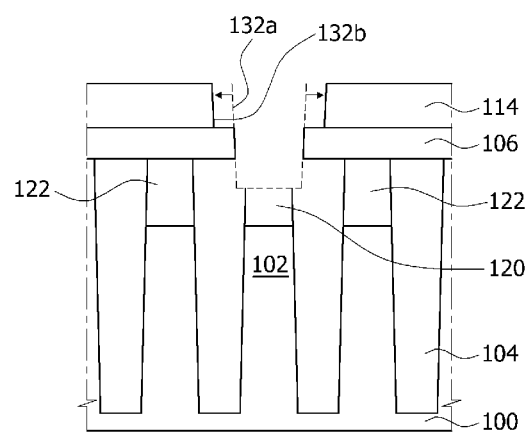
Figure 8B:
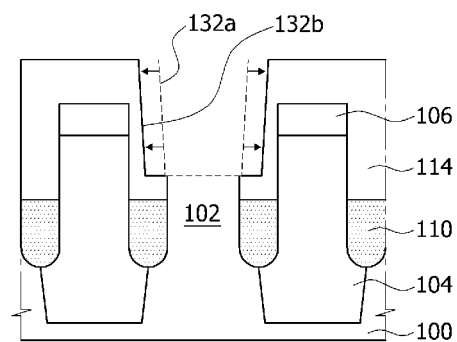
Figure 8C:
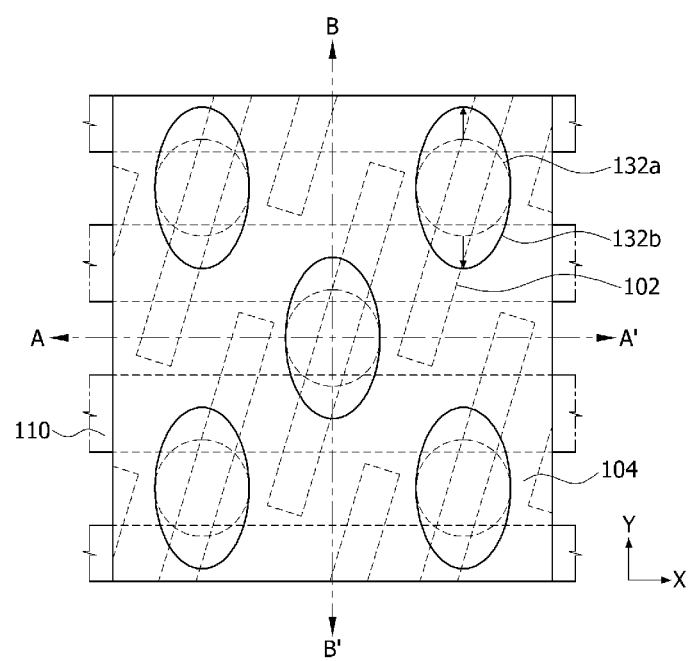

Referring to FIGS. 8A, 8B and 8C, an isotropic etch process may be applied to the substrate including the first hard mask layer 124 to isotropically etch only the capping layer 114 formed of a nitride layer. That is, the isotropic etch process may be performed to selectively etch the capping layer 114. As a result, the first bit line contact holes 132a may be enlarged in one direction (e.g., the second direction) which is substantially parallel with the line B-B' of FIG. 8C. Thus, the first bit line contact holes 132a having circular shapes may be deformed into bit line contact holes 132b having longish shapes, as illustrated in a plan view of FIG. 8C. Specifically, the isotropic etch process may be performed under a pressure of about 5 mTorr to about 100 mTorr and a bias power of about 0 watt to about 150 watts using an inductively coupled plasma (ICP) apparatus or an electron cyclotron resonance (ECR) apparatus. Alternatively, the isotropic etch process may be performed under a pressure of about 15 mTorr to about 100 mTorr and a bias power of about 0 watt to about 500 watts using a capacitively coupled plasma (CCP) apparatus. When the isotropic etch process is performed, the main etch gas may include at least one of a $C_xF_y$ gas (where, $1 \le x \le 5$ and $2 \le y \le 8$), a $C_xHF_y$ gas (where, $1 \le x \le 3$ and $1 \le y \le 3$), a $NF_3$ gas and a $SF_6$ gas, and the subsidiary gas may include at least one of an oxygen ($O_2$) gas, a CO gas, a COS gas, a nitrogen ($N_2$) gas, a $CH_4$ gas, an argon (Ar) gas and a helium (He) gas. In various embodiments, the isotropic etch process for selectively etching the capping layer 114 may be performed using a wet etch process that employs a phosphoric acid ($H_3PO_4$) solution or the like as an etchant.

The isotropic etch process for selectively etching the capping layer 114 may be performed without removal of the photoresist pattern 130 or the first hard mask layer 124 after forming the first bit line contact holes 132a. Alternatively, the isotropic etch process for selectively etching the capping layer 114 may be performed after all the photoresist pattern 130, the anti-reflection layer 128, the second hard mask layer 126 and the first hard mask layer 124 are removed. In this case, the upper corners of the bit line contact holes 132b may be formed to have rounded shapes. In various embodiments, an additional etch process for partially etching the hard mask pattern 106 may be performed to control the sidewall profiles of the bit line contact holes 132b after the isotropic etch process is performed. The additional etch process may be performed using an oxide etchant such as a buffered oxide etchant (BOE).

During the isotropic etch process, the capping layer 114 may be selectively etched. Thus, only an upper width of each first bit line contact hole 132a may be enlarged when viewed from a cross sectional view taken along the line A-A' of FIG. 8C (see FIG. 8A), and a total width of each first bit line contact hole 132a may be enlarged when viewed from a cross sectional view taken along the line B-B' of FIG. 8C (see FIG. 8B). The capping layer 114 on the hard mask pattern 106 may be partially removed in a subsequent process. Accordingly, a width of the final bit line contact holes 132b in the first direction substantially parallel with the X-axis may be substantially equal to that of the first bit line contact holes 132a in the first direction, and a width of the final bit line contact holes 132b in the second direction substantially parallel with the Y-axis may be greater than that of the first bit line contact holes 132a in the second direction. Hence, the final bit line contact holes 132b may be formed to have longish shapes, for example, oval shapes which are parallel with the second direction, as illustrated in a plan view of FIG. 8C.

Figure 9A:
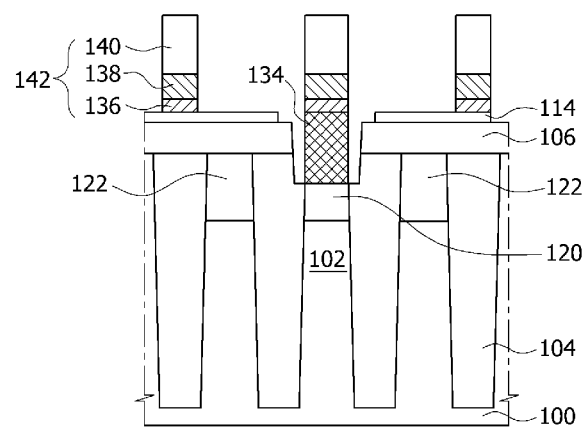
Figure 9B:
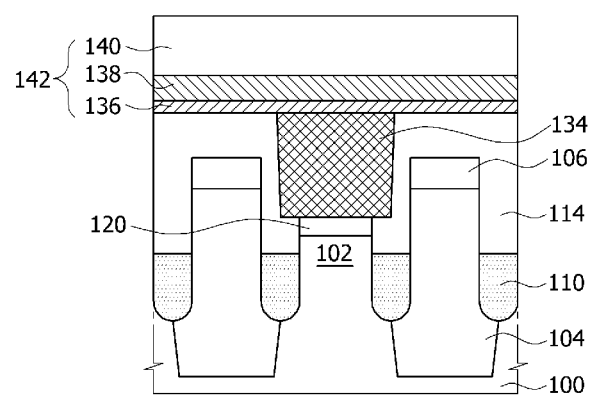
Figure 9C:
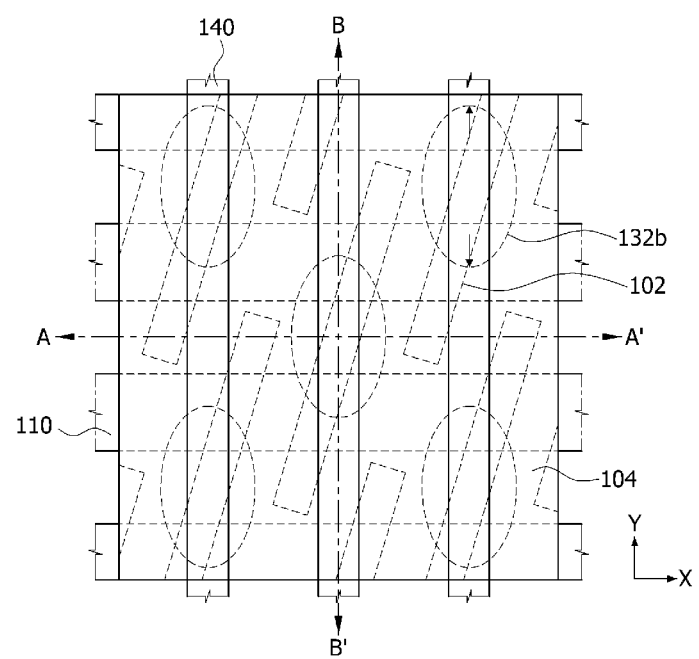

Referring to FIGS. 9A, 9B and 9C, a conductive layer, for example, a doped polysilicon layer may be formed on the capping layer 114 to fill the oval-shaped bit line contact holes 132b. The conductive layer may be planarized to form contact patterns 134 (e.g., bit line contact patterns) in respective ones of the oval-shaped bit line contact holes 132b.

Subsequently, a bit line conductive layer and a bit line hard mask layer 140 may be sequentially formed on the substrate including the bit line contact patterns 134. In various embodiments, the bit line conductive layer may be formed by sequentially stacking a titanium nitride (TiN) layer 136 and a tungsten (W) layer 138, and the bit line hard mask layer 140 may be formed of a silicon nitride layer. A barrier layer for preventing metal diffusion may be additionally formed before the bit line conductive layer is formed. The barrier layer may be formed by a stack layer of a metal layer and a metal compound layer. For example, the barrier layer may be formed by a stack layer of a titanium (Ti) layer and a titanium nitride (TiN) layer.

A photoresist pattern (not shown) for defining bit lines may be formed on the bit line hard mask layer 140, and the bit line hard mask layer 140 may be etched and patterned using the photoresist pattern as an etch mask. After the photoresist pattern is removed using a photoresist strip process, the bit line conductive layer (138+136) may be etched and patterned using the patterned bit line hard mask layer 140 as an etch mask to form bit lines 142. While the bit line conductive layer (138+136) is etched and patterned, both sides of each of the bit line contact patterns 134 in the bit line contact holes may be etched if a width of the patterned bit line hard mask layer 140 is less than a width of the bit line contact holes in the first direction parallel with the line A-A', as illustrated in FIG. 9A.

Thus, the width of the bit line contact patterns 134 in the first direction may be reduced to form bit line contact plugs 134 vertically self-aligned with the bit lines 142. The bit lines 142 including the patterned bit line conductive layer (138+136) and the patterned bit line hard mask layer 140 may be formed to extend in the second direction which is substantially perpendicular to the word lines 110 and to intersect the central portions of the active regions 102, as illustrated in a plan view of FIG. 9C. That is, the bit lines 142 may be formed to cross over the first impurity regions 120 in the active regions 102.

During the etch process for patterning the bit line conductive layer (138+136), at least one of a chlorine (Cl2) gas and a hydrogen bromide (HBr) gas may be used as a main etch gas of the etch process and at least one of an oxygen ($O_2$) gas, a nitrogen ($N_2$) gas, an argon (Ar) gas, a helium (He) gas, a methane ($CH_4$) gas and a silicon tetrachloride ($SiCl_4$) gas may be used as a subsidiary gas of the etch process. In addition, the etch process may be performed using a pulsed power. This etch recipe may prevent conductive tails from being formed at interfaces between the bit lines 142 and the bit line contact plugs 134.

Figure 10A:
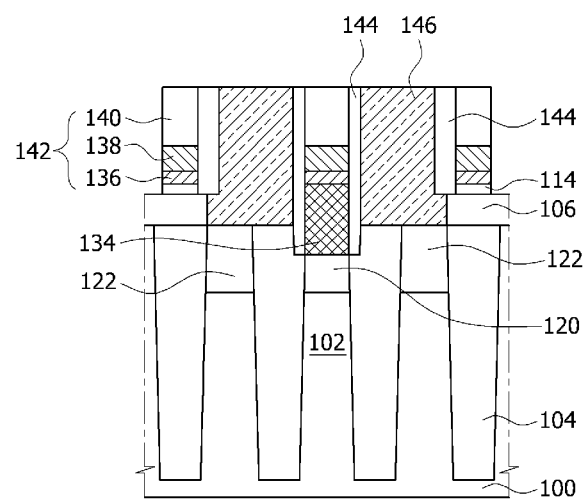
Figure 10B:
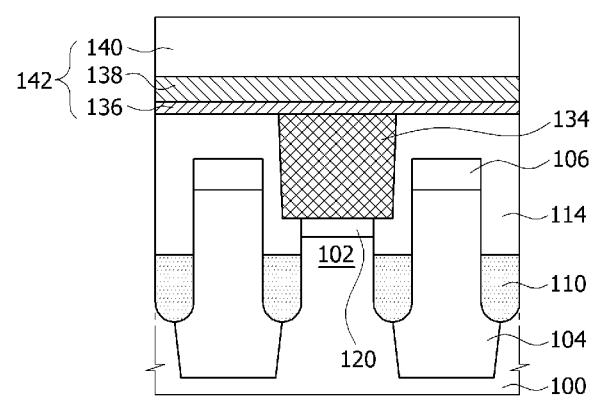
Figure 10C:
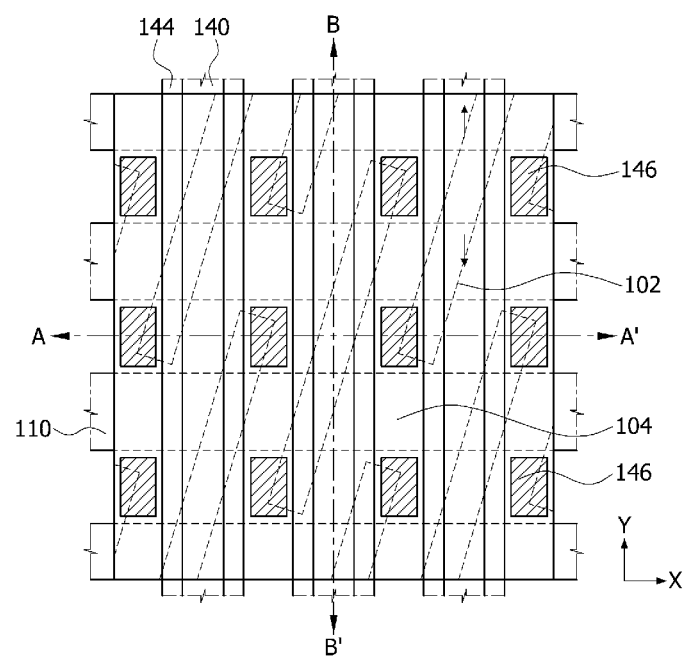

Referring to FIGS. 10A, 10B and 10C, a spacer insulation layer may be formed on an entire surface of the substrate including the bit lines 142. The spacer insulation layer may be formed by depositing a nitride layer to a thickness of about 20 angstroms to about 400 angstroms. The spacer insulation layer may be anisotropically etched or etched back to form bit line spacers 144 on sidewalls of the bit lines 142. The patterned bit line hard mask layer 140 and the bit line spacers 144 may electrically insulate the patterned bit line conductive layer (138+136) from storage node contact plugs formed in a subsequent process. That is, the patterned bit line conductive layer (138+136) may be electrically isolated by the patterned bit line hard mask layer 140 and the bit line spacers 144.

An interlayer insulation layer may be formed on an entire surface of the substrate including the bit line spacers 144 to fill spaces between the bit lines 142. A photoresist pattern may be formed on the interlayer insulation layer. The interlayer insulation layer, the capping layer 114 and the hard mask pattern 106 may be etched using the photoresist pattern as an etch mask, thereby forming storage node contact holes that expose respective ones of the second impurity regions 122. The photoresist pattern may be removed, and a conductive layer may be formed on the interlayer insulation layer to fill the storage node contact holes. The conductive layer may then be planarized to expose the interlayer insulation layer and to form storage node contact plugs 146 in respective ones of the storage node contact holes. The storage node contact plugs 146 may be separated from the bit lines 142 by the bit line spacers 144 and may be disposed between the bit lines 142. Further, the storage node contact plugs 146 may be electrically connected to respective ones of the second impurity regions 122 which are formed in both ends of the active regions 102.

Although not shown in the drawings, storage electrodes may be formed on respective ones of the storage node contact plugs 146, and a capacitor dielectric layer and a plate electrode may be sequentially formed on the storage electrodes to complete cell capacitors.

According to the embodiments described above, each of the first bit line contact holes may be formed to have a pair of first opposite sidewalls exposing a first oxide layer (e.g., the isolation layer 104), a second oxide layer (e.g., the hard mask pattern 106) and a nitride layer (e.g., the capping layer 114) which are sequentially stacked and a pair of second opposite sidewalls exposing only the nitride layer (e.g., the capping layer 114). The first opposite sidewalls may be substantially parallel with the second direction, and the second opposite sidewalls may be substantially parallel with the first direction. Thus, if the nitride layer is isotropically etched, the first bit line contact holes may be enlarged in one direction (including a positive direction and a negative direction opposite to the positive direction). As a result, longish bit line contact holes can be formed when viewed from a plan view. However, the above embodiments are merely some examples of the embodiments and may be deformed in many different forms. For example, each of the first bit line contact holes may be formed to have a pair of first opposite sidewalls exposing a first nitride layer (e.g., the isolation layer 104), a second nitride layer (e.g., the hard mask pattern 106) and an oxide layer (e.g., the capping layer 114) which are sequentially stacked and a pair of second opposite sidewalls exposing only the oxide layer (e.g., the capping layer 114). Thus, if the oxide layer is isotropically etched, the first bit line contact holes may be enlarged in one direction (including a positive direction and a negative direction opposite to the positive direction). As a result, longish bit line contact holes can be formed when viewed from a plan view.

According to the embodiments described above, contact holes may be formed in a plurality of material layers which are stacked, and each of the contact holes may be formed to include a pair of first opposite sidewalls exposing the plurality of material layers having different etch rates from each other and a pair of second opposite sidewalls exposing only one of the plurality of material layers. Thus, if one of the plurality of material layers is selectively etched using an isotropic etch process, longish contact holes such as oval contact holes that are difficult to define using only an exposure process can be formed when viewed from a plan view.

The embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of manufacturing a semiconductor device, the method comprising:
    defining an active region in a semiconductor substrate;
    forming line-shaped first insulation patterns on the semiconductor substrate to intersect the active region and to extend in a first direction;
    forming a second insulation layer on the first insulation patterns to fill spaces between the first insulation patterns;
    patterning the second insulation layer and the first insulation patterns to form a contact hole exposing a portion of the active region, the contact hole being formed to include a pair of first opposite sidewalls exposing the first insulation patterns and the second insulation layer and a pair of second opposite sidewalls exposing only the second insulation layer;
    isotropically etching the second insulation layer to enlarge the contact hole in a second direction substantially perpendicular to the first direction; and
    forming a conductive contact plug that fills the enlarged contact hole,
    wherein the first opposite sidewalls of the contact hole are substantially parallel with the second direction and the second opposite sidewalls of the contact hole are substantially parallel with the first direction.

2. The method of claim 1, wherein the first insulation patterns have a different etch rate from the second insulation layer while the second insulation layer is isotropically etched to enlarge the contact hole in substantially the second direction.

3. The method of claim 1, wherein the contact hole is formed by etching the second insulation layer and the first insulation patterns using an anisotropic etch process that exhibits substantially the same etch rate with respect to the second insulation layer and the first insulation patterns.

4. The method of claim 1, wherein isotropically etching the second insulation layer to enlarge the contact hole in the second direction is performed by an isotropic etch process exhibiting an etch condition that an etch rate of the second insulation layer is faster than that of the first insulation patterns.

5. The method of claim 4, wherein the isotropic etch process is a dry etch process performed using plasma or a wet etch process performed using an etchant.

6. A method of manufacturing a semiconductor device, the method comprising:
    forming a first insulation layer and a second insulation layer on the semiconductor substrate;
    forming a first contact hole pentrating the first insulation layer and the second insulation layer, wherein the first contact hole exposes a portion of the semiconductor substrate in a circle shape, wherein the first contact hole exposes the first insulation layer and the second insulation layer in the first direction, and exposes only the second insulation layer in the second direction;
    forming a second contact hole having a longish shape by isotropically etching the second insulation layer to enlarge the first contact hole in the second direction, wherein the second contact hole is defined by the first insulation layer in the first direction and by the second insulation layer in the second direction; and
    forming a conductive contact plug that fills the second contact hole.

7. The method of claim 6, wherein the first insulation layer have a different etch rate from the second insulation layer while the second insulation layer is isotropically etched to enlarge the first contact hole in the second direction.

8. The method of claim 6, wherein isotropically etching the second insulation layer to enlarge the first contact hole in the second direction is performed by an isotropic etch process exhibiting an etch condition that an etch rate of the second insulation layer is faster than that of the first insulation layer.

9. The method of claim 8, wherein the isotropic etch process is a dry etch process performed using plasma or a wet etch process performed using an etchant.

10. The method of claim 6, wherein the first insulation layer are formed of an oxide layer and the second insulation layer is formed of a nitride layer.

11. The method of claim 6, wherein isotropically etching the second insulation layer to enlarge the first contact hole in the second direction is performed using a wet etch process that employs a phosphoric acid solution as an etchant.

12. The method of claim 11, further comprising applying an additional etch process to the substrate including the second contact hole to control sizes and sidewall profiles of the second contact holes before the conductive contact plug are formed,
    wherein the additional etch process is performed by a wet etch process using an oxide etchant.

13. A method of manufacturing a semiconductor device, the method comprising:
    forming a first hard mask pattern exposing the pretermined region of an active region;
    forming a trench by etching the exposed region of the active region;
    forming a buried gate filled in lower portions of the trench;
    forming a capping layer disposed on the buried gate and the first hard mask pattern;
    forming a first bit line contact hole pentrating the capping layer and the first hard mask pattern, wherein the first bit line contact hole exposes a portion of the active region in a circle shape, wherein the first bit line contact hole exposes the capping layer and the first hard mask pattern in the first direction, and exposes only the capping layer in the second direction;
    forming a second bit line contact hole having a longish shape by isotropically etching the capping layer to enlarge the first bit line contact hole in the second direction, wherein the second bit line contact hole is defined by the hard mask pattern in the first direction and by the capping layer in the second direction; and
    forming a conductive contact plug that fills the second bit line contact hole.

14. The method of claim 13, wherein the hard mask pattern have a different etch rate from the capping layer while the capping layer is isotropically etched to enlarge the first bit line contact hole in the second direction.

15. The method of claim 13, wherein isotropically etching the capping layer to enlarge the first bit line contact hole in the second direction is performed by an isotropic etch process exhibiting an etch condition that an etch rate of the capping layer is faster than that of the hard mask pattern.

16. The method of claim 15, wherein the isotropic etch process is a dry etch process performed using plasma or a wet etch process performed using an etchant.

17. The method of claim 15, wherein the hard mask pattern are formed of an oxide layer and the capping layer is formed of a nitride layer.

18. The method of claim 13, wherein isotropically etching the capping layer to enlarge the first bit line contact hole in the second direction is performed using a wet etch process that employs a phosphoric acid solution as an etchant.

19. The method of claim 13, further comprising applying an additional etch process to the substrate including the second bit line contact hole to control sizes and sidewall profiles of the second bit line contact holes before the conductive contact plug are formed,
    wherein the additional etch process is performed by a wet etch process using an oxide etchant.

* * * * *